United States Patent
Harigae (10) Patent No.: US 7,817,074 B2
(45) Date of Patent: Oct. 19, 2010

(54) D/A CONVERTER

(75) Inventor: Shinichi Harigae, Kyoto (JP)

(73) Assignee: Panasonic Corporation, Osaka (JP)

( * ) Notice: Subject to any disclaimer, the term of this patent is extended or adjusted under 35 U.S.C. 154(b) by 86 days.

(21) Appl. No.: 12/279,391

(22) PCT Filed: Feb. 9, 2007

(86) PCT No.: PCT/JP2007/052351

§ 371 (c)(1),
(2), (4) Date: Aug. 14, 2008

(87) PCT Pub. No.: WO2007/094255

PCT Pub. Date: Aug. 23, 2007

(65) Prior Publication Data

US 2009/0027248 A1   Jan. 29, 2009

(30) Foreign Application Priority Data

Feb. 14, 2006   (JP) .............................. 2006-036284

(51) Int. Cl.
*H03M 3/00*   (2006.01)
(52) U.S. Cl. ....................... 341/143; 341/144
(58) Field of Classification Search ............. 341/143, 341/144
See application file for complete search history.

(56) References Cited

U.S. PATENT DOCUMENTS

| | | | | |
|---|---|---|---|---|
| 5,252,973 A * | 10/1993 | Masuda | ...................... | 341/131 |
| 5,550,544 A * | 8/1996 | Sakiyama et al. | ........... | 341/155 |
| 6,515,601 B2 * | 2/2003 | Fukuhara et al. | ............ | 341/131 |
| 6,538,589 B2 * | 3/2003 | Okuda et al. | ................. | 341/143 |
| 6,664,913 B1 * | 12/2003 | Craven et al. | ............... | 341/200 |
| 7,315,264 B2 * | 1/2008 | Andersen | ...................... | 341/76 |
| 7,355,540 B2 * | 4/2008 | Kitahira | ....................... | 341/143 |
| 2004/0051654 A1 * | 3/2004 | Ohkuri et al. | ............... | 341/118 |
| 2007/0171110 A1 * | 7/2007 | Kitahira | ...................... | 341/143 |
| 2007/0229335 A1 * | 10/2007 | Kitahira | ...................... | 341/143 |
| 2009/0066549 A1 * | 3/2009 | Thomsen et al. | ............ | 341/143 |

FOREIGN PATENT DOCUMENTS

| | | |
|---|---|---|
| JP | 9-214259 | 8/1997 |
| JP | 2002-353750 | 12/2002 |
| JP | 2003-110376 | 4/2003 |
| JP | 2005-20264 | 1/2005 |
| WO | 2003/030373 | 4/2003 |

OTHER PUBLICATIONS

International Search Report issued Mar. 27, 2007 in International (PCT) Application PCT/JP2007/052351.

* cited by examiner

*Primary Examiner*—Linh V Nguyen
(74) *Attorney, Agent, or Firm*—Wenderoth, Lind & Ponack, L.L.P.

(57) ABSTRACT

A D/A converter (100) includes a delta-sigma modulation circuit (102) including a quantizer (105) that receives a digital signal to quantize it based on a quantization reference value, a local D/A conversion circuit (107) for converting an output from the delta-sigma modulating circuit to an analog signal to be outputted, and a control circuit (109) for correcting the quantization reference value of the quantizer. The quantization reference value is established for each of a plurality of discrete output values that the quantizer may output. The control circuit (109) corrects the quantization reference value to cancel any distortion that would occur in a circuit, following the delta-sigma modulation circuit (102) and including the local D/A conversion circuit (107).

4 Claims, 8 Drawing Sheets

D/A CONVERTER

TECHNICAL FIELD

The present invention relates to a D/A converter for converting a digital signal into an analog signal, and more particularly to a D/A converter having a delta-sigma modulation circuit.

BACKGROUND ART

Figure 5:
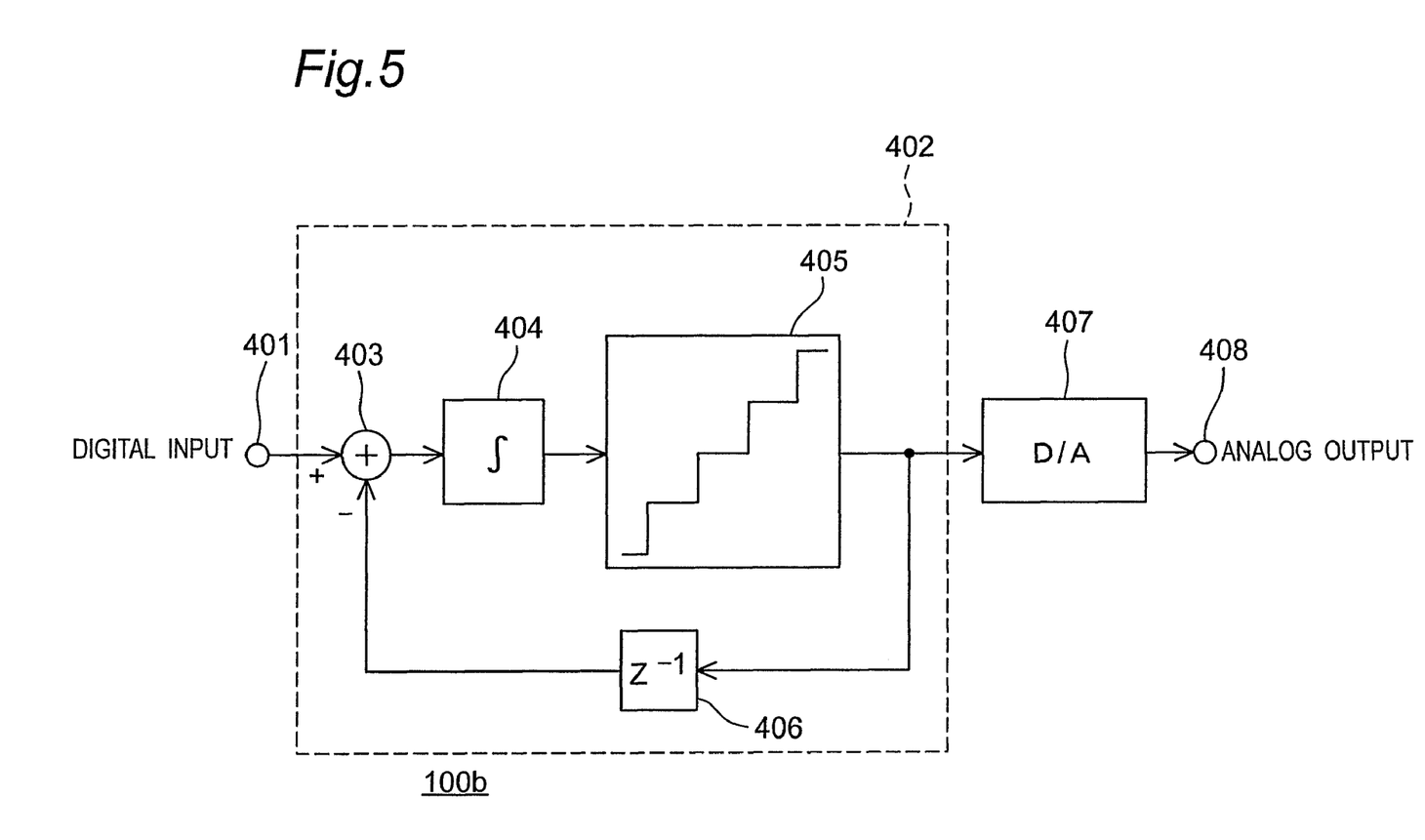
FIG. 5 is a block diagram of a conventional D/A converter.

A D/A converter using a delta-sigma modulation circuit has been known as means for converting a digital signal into an analog signal. An example of a conventional D/A converter is shown in FIG. 5. In FIG. 5, a digital input 401 is PCM data of a long word length, for example, 16 bits. Noise shaping is applied to the digital input 401 by a delta-sigma modulation circuit 402, and the digital input 401 is converted into digital data of several bits. The output of the delta-sigma modulation circuit 402 is put into a local D/A conversion circuit 407 to be an analog output 408.

Regarding the operation of the delta-sigma modulation circuit 402, the digital input 401 is fed into an adder 403 and is summed up with a negative feedback signal from a delay unit 406, and then is integrated by an integrator 404. The output of the integrator 404 is put into a quantizer 405, and is re-quantized into about several bits, and then is put into the local D/A conversion circuit 407. The output of the quantizer 405 is fed into the delay unit 406 as a feedback signal.

Figure 6:
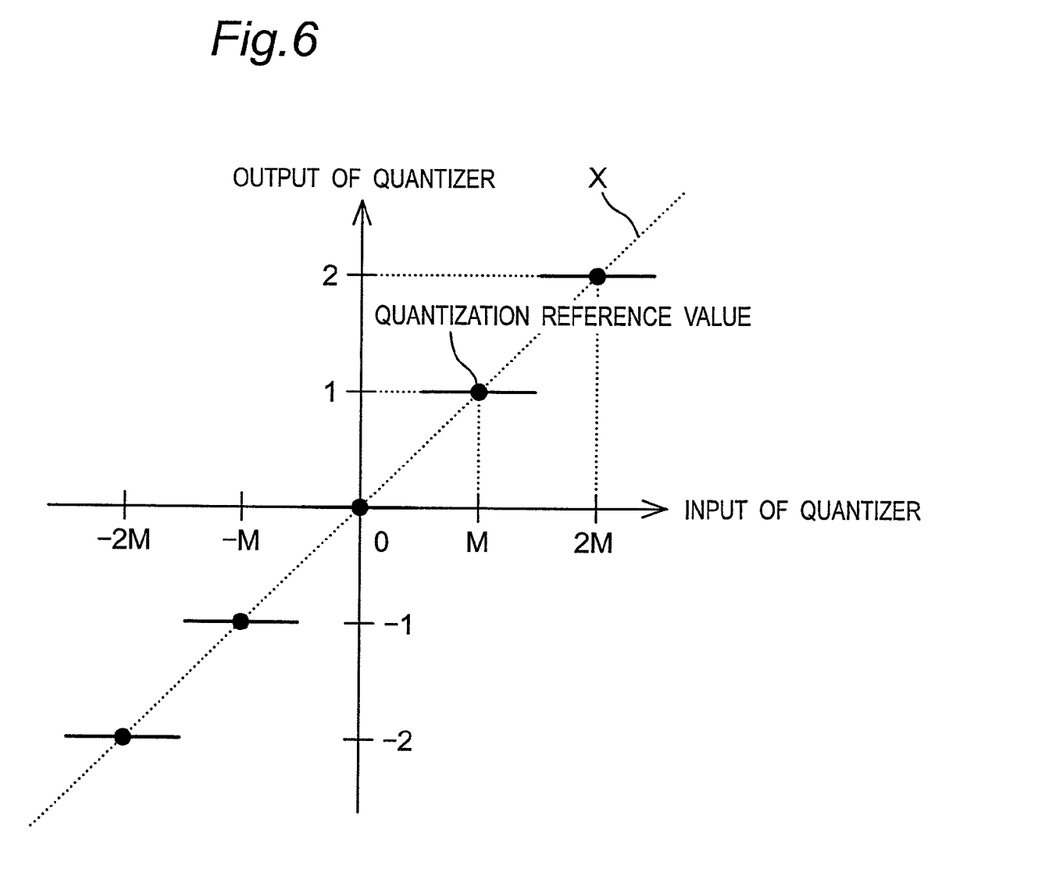
FIG. 6 shows input and output characteristics of a conventional quantizer.

The quantizer 405 quantizes the input digital value again according to a quantization reference value. The quantization reference value is set according to the quantization value as a discrete value that can be produced from the quantizer 405. FIG. 6 shows the input and output characteristic of the quantizer 405 of a conventional D/A converter 100b. In the diagram, the black circle marks (●) indicate the quantization reference values. In the diagram, the quantizer 405 re-quantizes the input in five steps from +2 to −2. The quantization reference values corresponding to these five values have linear characteristics (see broken line X). For example, when the input to the quantizer 405 is M, the output of the quantizer 405 is 1, resulting in the quantization error of 0. Similarly, when the input to the quantizer 405 is 2M, the output of the quantizer 405 is 2, resulting in quantization error of 0. The threshold level between adjacent quantization values is an intermediate value to the quantization reference values, and, for example, the threshold value between quantization value 0 and quantization value 1 is M/2.

Generally, in the D/A converter, desirably, there should be no distortion in the signal propagation route, but actually distortion occurs in the local D/A conversion circuit or the analog circuit connected to the rear stage of the local D/A conversion circuit. The following explanation relates to distortion occurring when a pulse width modulation circuit is used as local D/A conversion circuit 407.

Figure 7A:
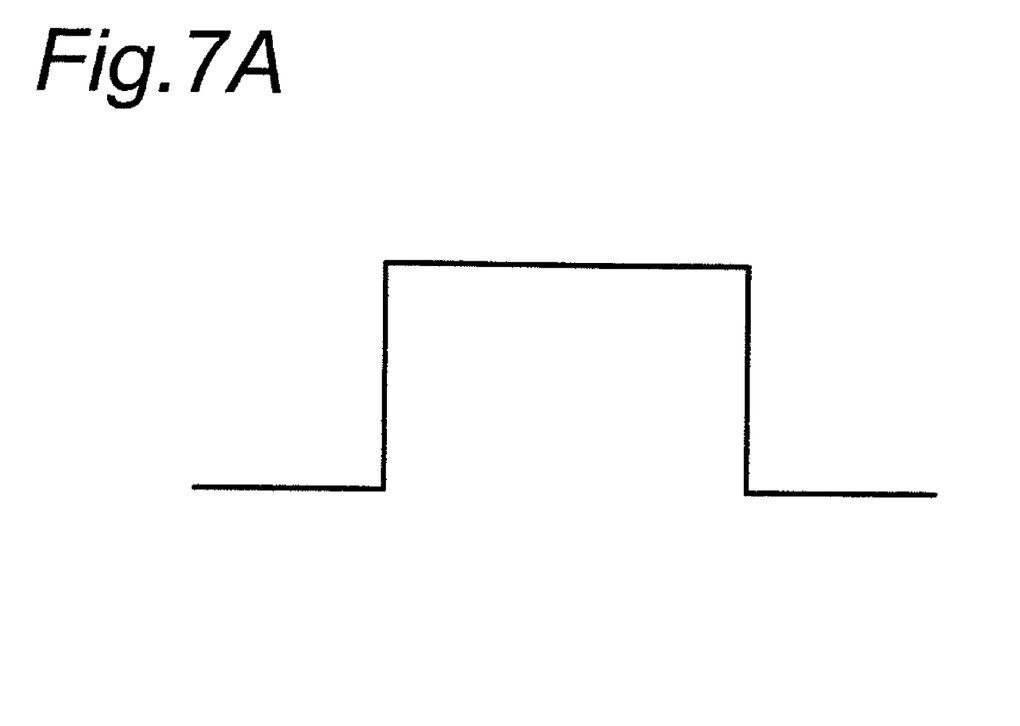
FIGS. 7A and 7B are output waveform diagrams of a local D/A conversion circuit.
Figure 7B:
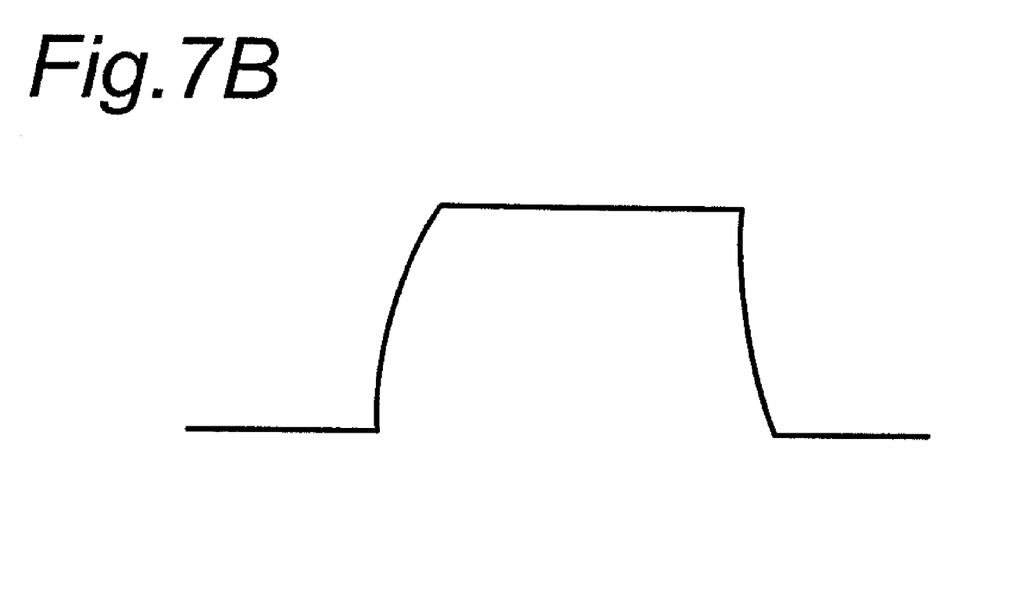

The pulse width modulation circuit 407 converts a digital signal of several bits into two values of H level and L level (one bit). The binary signal is ideally a signal as shown in FIG. 7A, but actually has a waveform distortion as shown in FIG. 7B according to analog factors, such as effects of wiring impedance. Occurrence of such waveform distortion deteriorates the characteristics of analog outputs to each output value of the quantizer 405. That is, an ideal analog output has a linear characteristic to the quantizer output (input to the pulse width modulation circuit 407), but the actual analog output has a nonlinear characteristic.

To solve this problem, for example, a signal amplifying device as disclosed in patent document 1 is proposed. According to patent document 1, the distortion quantity is calculated from differences in rising and falling between a pulse width modulated signal and a signal amplified from the pulse width modulated signal to a specified size, and the distortion quantity is subtracted from the quantizer output, so that the distortion can be decreased.

Patent document 1: JP-A-2003-110376

DISCLOSURE OF INVENTION

However, the signal amplifying device in patent document 1 requires a level converter and other parts, and the number of parts is increased in the entire circuit so that the manufacturing cost is increased or the mounting area is increased.

Further, when the distortion quantity is large, the correction amount to be added to the feedback loop may be large, and thus oscillation may occur. If the gain of delta-sigma modulation means is lowered in order to prevent such oscillation under the assumption of a large distortion quantity, the signal amplification rate becomes smaller when the distortion quantity is small.

It is hence an object of the invention to solve these problems and present a D/A converter capable of realizing small distortion and a high signal amplification rate without increasing the circuit size.

A D/A converter according to the invention includes a delta-sigma modulation circuit having a quantizer which receives a digital signal and quantizes the digital signal according to a quantization reference value, a local D/A conversion circuit for converting the output of the delta-sigma modulation circuit to an analog signal to output the analog signal, and a control circuit for correcting the quantization reference value of the quantizer. The quantization reference value is set in every one of plural discrete output values that can be output from the quantizer. The control circuit corrects the quantization reference value of the quantizer so as to cancel the generated distortion in a circuit following and connected to the delta-sigma modulation circuit.

That is, when the quantization reference value of the quantizer corresponding to the output value "N" of the quantizer is "M", and an ideal analog output signal value corresponding to the output value "N" of the quantizer is "P", if the actual analog output signal is "P×α" with respect to the analog output signal value "P", the quantization reference value is corrected to "M×α" so that the effect of the distortion is canceled and the resulting actual analog output signal is "P".

According to the D/A converter of the invention, the distortion can be decreased only by setting the quantization reference value of the quantizer by the control circuit without adding a circuit for a level converter or the like. Thus increasing of circuit scale can be suppressed, and a high signal amplification rate may be assured.

DESCRIPTION OF REFERENCE NUMERALS

101 Digital input
102 Delta-sigma modulation circuit
103 Adder
104 Integrator
105 Quantizer
106 Delay unit
107, 107b Local D/A conversion circuit
108 Analog output
109 Control circuit
401 Digital input
402 Delta-sigma modulation circuit
403 Adder
404 Integrator
405 Quantizer
406 Delay unit
407 Local D/A conversion circuit

BEST MODE FOR CARRYING OUT THE INVENTION

An embodiment of a D/A converter of the invention is described below with reference to the accompanying drawings.

Figure 1:
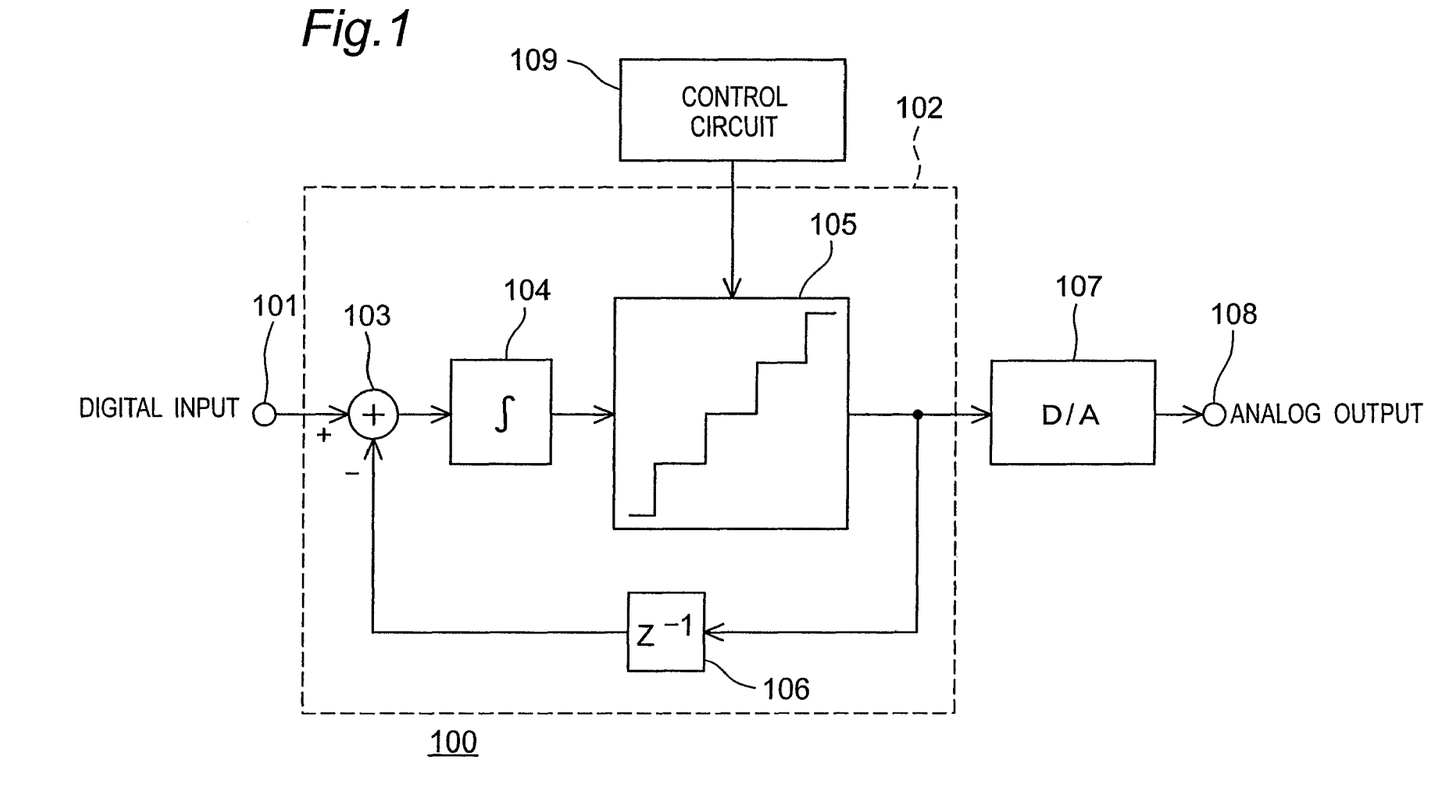
FIG. 1 is a block diagram of a D/A converter of the invention.

FIG. 1 is a block diagram of a D/A converter according to an embodiment of the invention. A D/A converter 100 includes a delta-sigma modulation circuit 102 for processing an input signal by delta-sigma modulation, a control circuit 109 for controlling the quantizing operation of the delta-sigma modulation circuit 102, and a local D/A conversion circuit 107 for processing the output of the delta-sigma modulation circuit 102 by PWM (pulse width modulation) and outputting the processed signal as an analog output. The delta-sigma modulation circuit 102 has an adder 103, an integrator 104, a quantizer 105, and a delay unit 106.

The delta-sigma modulation circuit 102 receives a digital input 101, as an input signal, which is PCM data of long word length, for example, 16 bits. In the delta-sigma modulation circuit 102, the digital input 101 is added to a negative feedback signal from the delay unit 106 by the adder 103, and then integrated by the integrator 104. The output of the integrator 104 is fed into the quantizer 105, and is re-quantized by the quantizer 105. The output of the quantizer 105 is fed into the local D/A conversion circuit 107. The local D/A conversion circuit 107 modulates the output of the quantizer 105 by PWM to output it as an analog output 108.

The quantizer 105 is explained below. The quantizer 105 receives a digital value (output of integrator 104), and converts it into a quantized value which is a discrete value according to a quantization reference value, and produces as an output. In this example, the quantizer 105 performs re-quantization for converting 16-bit data into 3-bit data. The quantization reference value is set corresponding to each quantized value. The quantization reference value is equal to an input value of the quantizer 105 which makes the quantization error zero. The error of input value of quantizer 105 and the quantization reference value is fed back, and added to the digital input value 101 of the next period. The quantizer re-quantizes the digital input value added with the error. The input and output characteristics of the quantizer 105 are varied by varying the quantization reference value.

Setting of quantization reference value of the quantizer 105 of the embodiment is explained. The quantization reference value of the quantizer 105 is corrected (adjusted) by the control circuit 109. In particular, in the embodiment, the quantization reference value of the quantizer 105 is determined in consideration of the distortion characteristics of the local D/A conversion circuit 107 and the analog circuit following it.

Figure 3A:
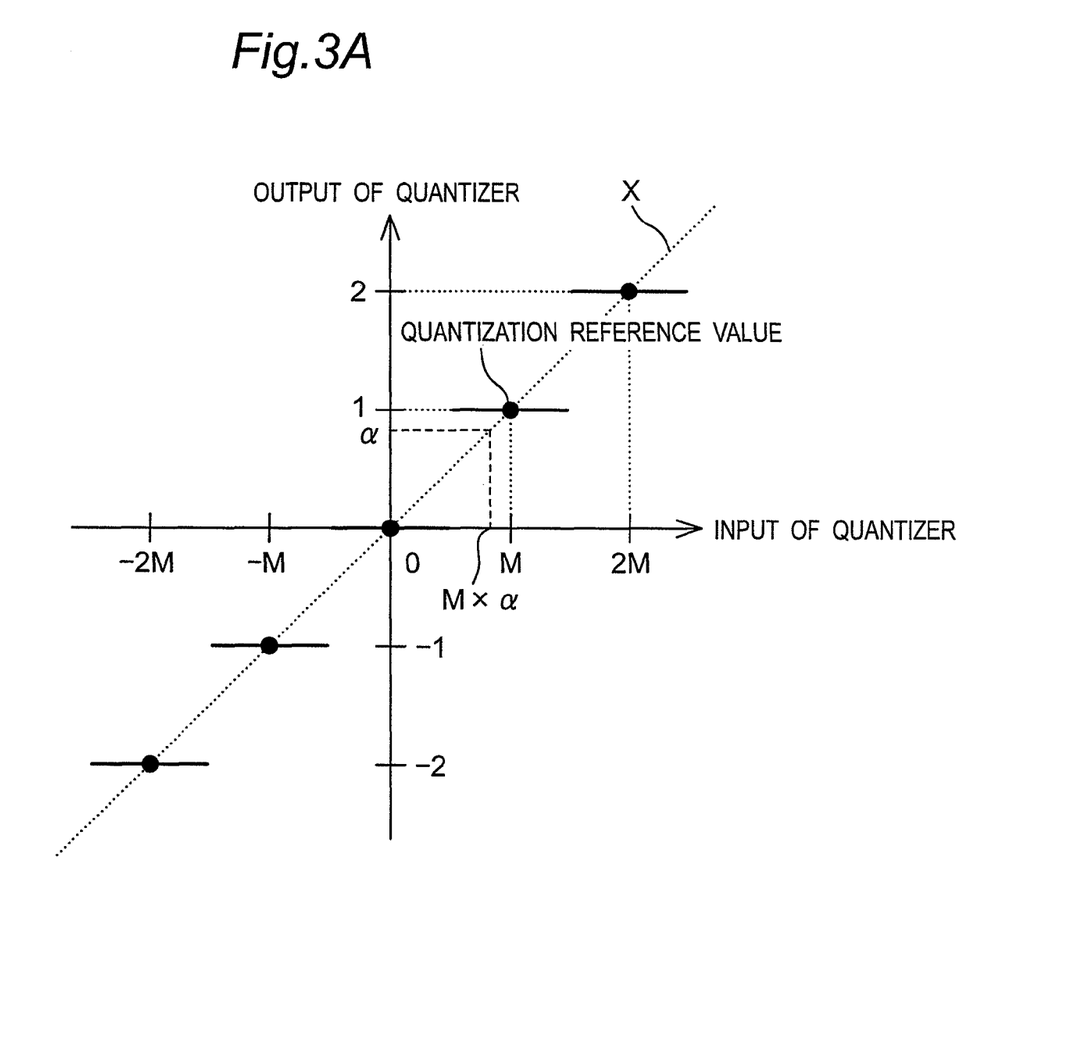
FIG. 3A shows input and output characteristics of a quantizer before quantization reference value correction according to the invention.

In the embodiment, the quantizer 105 re-quantizes the input into quantization value (output of the quantizer 105) in five steps from −2 to +2. The quantization reference value of the quantizer 105 is determined so that the input and output characteristics may be linear as shown in FIG. 3A in the initial state. That is, in the quantizer 105, "M" is set as initial value of quantization reference value corresponding to quantized value "1", and "2M" is set as initial value of quantization reference value corresponding to quantized value "2". The quantization reference value of the quantizer 105 is corrected by the control circuit 109, and then the D/A converter 100 is in usable stage. Correction of quantization reference value is explained below.

Figure 2:
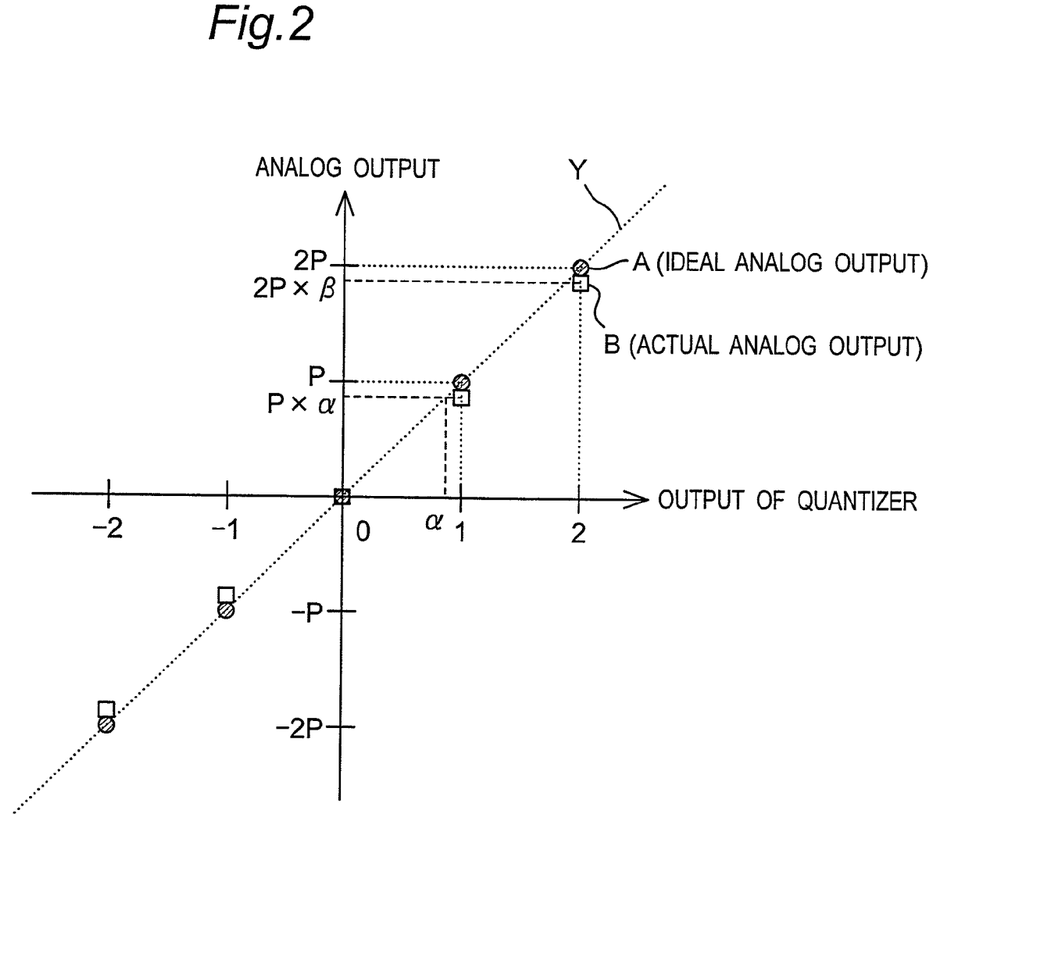
FIG. 2 shows input and output characteristics of a local D/A conversion circuit and an analog circuit following the local D/A conversion circuit.

FIG. 2 is a diagram showing input and output characteristics of local D/A conversion circuit 107 and the analog circuit following the local D/A conversion circuit 107. That is, from FIG. 2, the characteristics of distortion occurring in the local D/A conversion circuit 107 and the analog circuit following it can be understood. In the diagram, symbol "A" denotes an ideal analog output, and symbol "B" shows an actual analog output including distortion. As clear from the diagram, an ideal characteristic (broken line Y) shows a linear characteristic. For example, an ideal analog output value corresponding to output value "1" of the quantizer 105 is "P". However the actual analog output is "P×α", a smaller value than the ideal analog output value "P" (α is a positive value of 1 or less). Similarly, an ideal analog output value corresponding to output value "2" of the quantizer 105 is "2P". However the actual analog output is "2P×β" (β is a positive value of 1 or less).

Herein, according to the ideal characteristic (broke line Y), the output value of the quantizer corresponding to the analog output "P×α" is "α". On the other hand, as shown in FIG. 3A, when the quantization reference value corresponding to output (quantized value) "1" of the quantizer 105 is "M", the quantization reference value corresponding to quantized value "α" is "M×α". Hence, the actual analog output value "P×α" is regarded to be an ideal analog output value when the quantization reference value is multiplied by "α". That is, when the actual analog output is changed α times of the ideal analog output due to distortion, the quantization reference value "M" corresponding to quantized value "1" is corrected by multiplying "α", the quantized value is virtually multiplied by 1/α. Subsequently, due to distortion of the analog circuit, the analog output is changed "α" times, so that the distortion can be ultimately canceled. As for quantized value "2", similarly, when the actual analog output is changed "β" times of the ideal analog output "2M", the quantization reference value corresponding to the quantized value "2" is set at "2M×β", so that the distortion can be canceled. Thus, on the basis of actual analog output characteristics corresponding to all quantized values, the quantization reference value to each quantized value can be corrected.

Figure 3B:
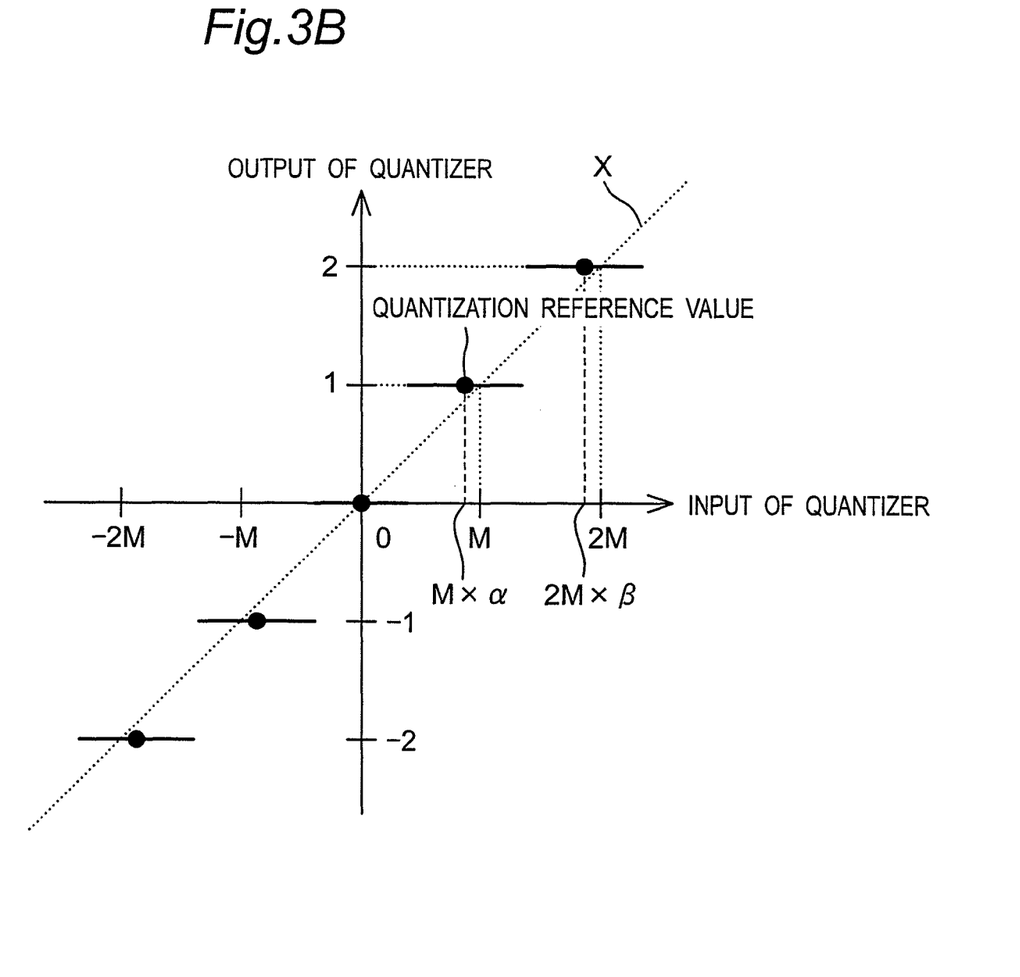
FIG. 3B shows input and output characteristics of a quantizer after quantization reference value correction according to the invention.

FIG. 3B shows the input and output characteristics of the quantizer 105 in which the quantization reference value is corrected by the control circuit 109 in the explained manner. In this drawing, the black circle mark (●) shows the quantization reference value. As shown in FIG. 3B, the quantization reference value corresponding to quantized value "1" is corrected to "M×α", and the quantization reference value corresponding to quantized value "2" is corrected to "2M×β". Other quantization reference values are also corrected similarly in consideration of distortion characteristics of the analog circuit. In FIG. 3B, when the input value of the quantizer 105 is "M×α", the output of the quantizer 105 is "1". At this time, the input value of the quantizer 105 is equal to quantization reference value "M×α", and thus quantization error does not occur. Referring now to FIG. 2, the quantizer output value "1" corresponds to an actual analog output value "P×α", and hence the amplification factor is P/M (=(P×α)/(M×α)). Similarly, in FIG. 3B, with the input value of the quantizer 105 of "2M×β", the output of the quantizer 105 is "2". At this time, the input value of the quantizer 105 is equal to the quantization reference value "2M×β", and hence quantization error does not occur. Referring to FIG. 2, the quantizer output "2" corresponds to an actual analog output value "2P×β", and thus the amplification factor is P/M (=(2P×β)/(2M×β)). Thus, since the amplification factor is always constant, the analog output is linear so that the distortion is decreased.

If the correction amount is large for the corrected quantization reference value, that is, if the correction is done so as to increase the generated quantization error, oscillation may occur. To prevent oscillation, the control circuit 109 may correct again all corrected quantization reference values by further multiplying them by constant A. As a result, the quantization 105 having a high amplification factor is realized while suppressing oscillation. Herein, the constant A is calculated by A=y/x, where x is the maximum value of quantization error before correction of quantization reference value, and y is the maximum value of quantization error after correction of quantization reference value. However, depending on the configuration of the delta-sigma modulation circuit, not limited to this method, it may be calculated by other proper method.

The threshold of adjacent quantization values is desired to be a middle point of the adjacent quantization reference values so that the quantization error may be suppressed under a predetermined value. However, a proper threshold may be determined depending on the characteristics of the feedback circuit in the delta-sigma modulation circuit.

The distortion characteristics of the analog output may be calculated by an additional circuit for measuring the characteristics, otherwise the characteristics may be preliminarily measured by a measuring device. In such configuration, the control circuit 109 may determine the quantization reference value of the quantizer 105 so that the distortion occurring in the local D/A conversion circuit 107 and the circuit following it may be corrected preliminarily by the quantizer 105, and hence the level converter and other parts are not needed and the distortion can be reduced at low cost.

In the embodiment, a linear delta-sigma modulation circuit is used, but not limited to this, a quadratic or higher degree delta-sigma modulation circuit may be also used.

In the embodiment, it is designed to consider the distortion characteristics occurring in the local D/A conversion circuit 107 and the analog circuit following it, but the quantization reference value may be corrected in consideration of the distortion characteristics occurring in only the local D/A conversion circuit 107.

Figure 4:
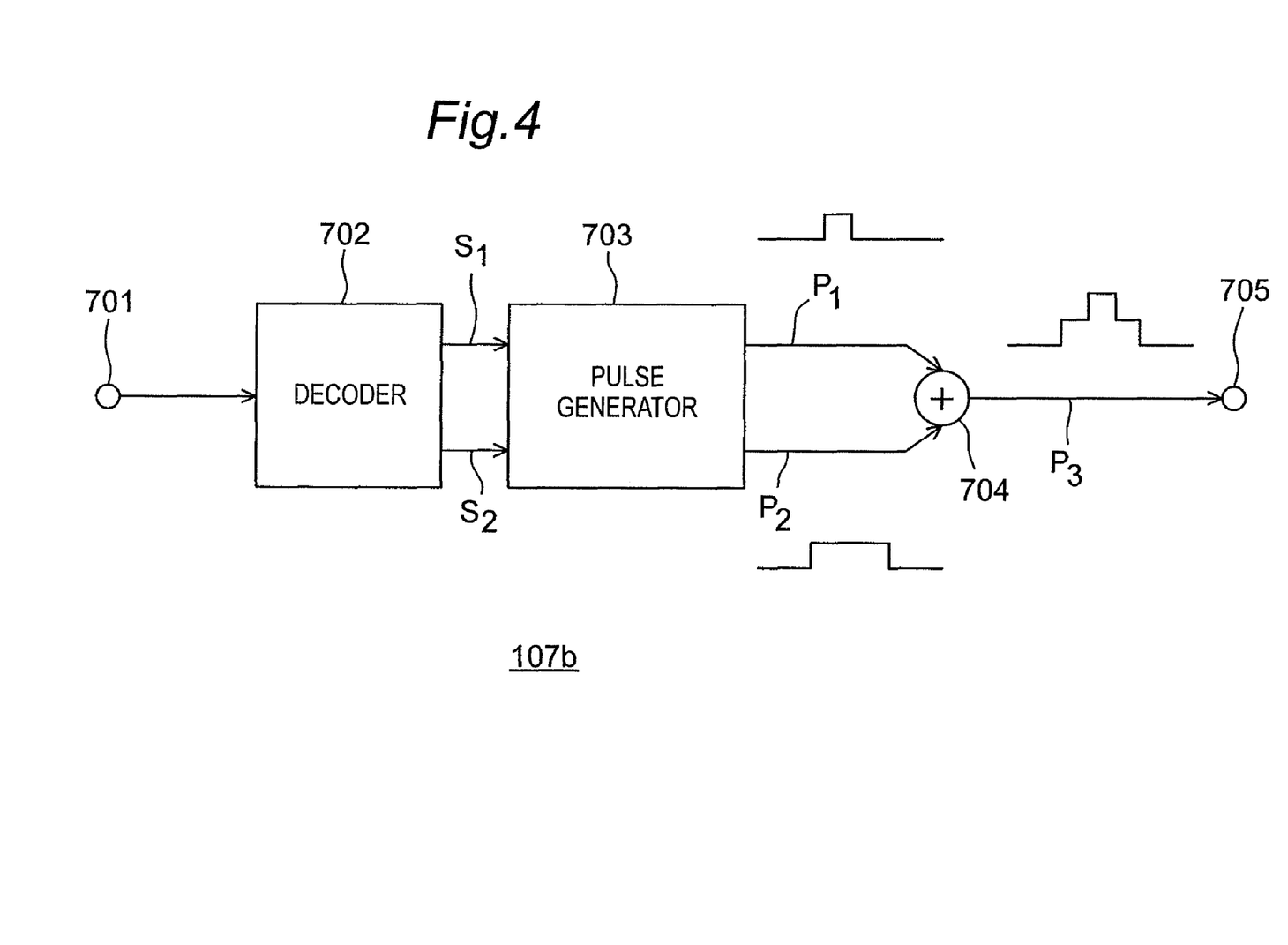
FIG. 4 is a block diagram of a local D/A conversion circuit capable of producing multi-stage pulse signals.

The local D/A conversion circuit 107 is not limited to the PWM modulation circuit described above. FIG. 4 shows other configuration of local D/A conversion circuit following and connected to the D/A converter 100 of the embodiment. The local D/A conversion circuit 107b shown in FIG. 4 includes a decoder 702, a pulse generator 703, and an adder 704. The decoder 702 receives a quantized digital value 701 from the D/A converter 100 and decodes the digital value 701 to generate two decoded signals S1 and S2. The decoded signals S1 and S2 are generated, for example, by decoding the upper bits and lower bits of the digital value 701. The pulse generator 703 generates pulse signals P1 and P2 which are processed in PWM corresponding to the decoded signals S1 and S2. The pulse signals are different in amplitude of pulse. The adder 704 adds pulse values P1 and P2 to generate and output an analog output 705. The distortion of input and output characteristics is measured to the local D/A conversion circuit 107b shown in FIG. 4, and the quantization reference value of the quantizer 105 is corrected so as to cancel the distortion, so that the distortion occurring in the local D/A conversion circuit 107b can be canceled.

INDUSTRIAL APPLICABILITY

The D/A converter of the invention is capable of decreasing the distortion with a simple circuit configuration, and is very useful for D/A conversion used in audio appliances and others.

Although the present invention has been described in connection with specified embodiments thereof, many other modifications, corrections and applications are apparent to those skilled in the art. Therefore, the present invention is not limited by the disclosure provided herein but limited only to the scope of the appended claims.

The present disclosure relates to subject matter contained in Japanese Patent Application No. 2006-036284, filed on Feb. 14, 2006, which is expressly incorporated herein by reference in its entirety.

The invention claimed is:

1. A D/A converter comprising:
a delta-sigma modulation circuit including a quantizer for receiving a digital signal and quantizing the digital signal according to a quantization reference value;
a local D/A conversion circuit for converting an output of the delta-sigma modulation circuit to an analog signal and outputting the analog signal; and
a control circuit for correcting the quantization reference value of the quantizer,
wherein the quantization reference value is set for every one of plural discrete output values that could be output from the quantizer,
wherein the control circuit corrects the quantization reference value by multiplying the quantization reference value of the quantizer by a factor α,
wherein the factor α is determined based on a distortion occurring in circuit following and connected to the delta-sigma modulation circuit, and
wherein an output of the circuit following and connected to the delta-sigma modulation circuit is changed to α times an ideal output value thereof due to the distortion occurring in the circuit following and connected to the delta-sigma modulation circuit.

2. The D/A converter according to claim 1, wherein the control circuit further multiplies the corrected quantization reference value by a constant A.

3. The D/A converter according to claim 2, wherein the constant A is calculated by A=y/x, where x is a maximum value of quantization error before the correction of the quantization reference value, and y is a maximum value of quantization error after the correction of the quantization reference value.

4. The D/A converter according to claim 1, wherein the local D/A conversion circuit converts the output from the delta-sigma modulation circuit to plural signals, modulates the plural signals by pulse width modulation, weights the modulated plural signals, and adds the plural weighted signals to create the analog signal.

* * * * *